(12) United States Patent
Suda (10) Patent No.: US 7,136,404 B2
(45) Date of Patent: Nov. 14, 2006

(54) LASER SCANNING DEVICE

(75) Inventor: Tadaaki Suda, Saitama-ken (JP)

(73) Assignee: PENTAX Corporation, Toyko (JP)

( * ) Notice: Subject to any disclaimer, the term of this patent is extended or adjusted under 35 U.S.C. 154(b) by 422 days.

(21) Appl. No.: 10/443,843

(22) Filed: May 23, 2003

(65) Prior Publication Data

US 2003/0219049 A1    Nov. 27, 2003

(30) Foreign Application Priority Data

May 27, 2002    (JP) .............................. 2002-151817

(51) Int. Cl.
*H01S 3/13* (2006.01)

(52) U.S. Cl. .............................. 372/29.015; 372/38.01; 372/38.02

(58) Field of Classification Search ........... 372/29.015, 372/24, 38.01, 38.02, 44
See application file for complete search history.

(56) References Cited

U.S. PATENT DOCUMENTS 6,246,705 B1 *  6/2001  Kasai .......................... 372/24

\* cited by examiner

*Primary Examiner*—Minsun Oh Harvey
*Assistant Examiner*—Dung (Michael) T. Nguyen
(74) *Attorney, Agent, or Firm*—Greenblum & Bernstein, P.L.C.

(57) ABSTRACT

A laser scanning apparatus is provided with a laser diode that is driven to emit a laser beam, a scanning optical system that scans the laser beam emitted by the laser diode on a surface to be scanned, and a controller that drives the laser diode by supplying electrical current to the laser diode. The controller supplies an extra electrical current to the laser diode only at an initial stage of driving of the laser diode so as to cancel an effect of a rising delay of its output intensity.

18 Claims, 9 Drawing Sheets

FIG.4A S/H OUTPUT

FIG.4B ATTENUATOR OUTPUT

FIG.4C SECOND SWITCH OUTPUT

FIG.4D ADDER OUTPUT

FIG.4E FIRST SWITCH OUTPUT

FIG.4F VIDEO SIGNAL

FIG.4G OUTPUT INTENSITY OF LASER DIODE

FIG.7A S/H OUTPUT

FIG.7B BIAS REFERENCE VOLTAGE

FIG.7C SUBTRACTION CIRCUIT OUTPUT

FIG.7D VARIABLE ATTENUATOR OUTPUT

FIG.7E SECOND SWITCH OUTPUT

FIG.7F FIRST ADDER OUTPUT

FIG.7G FIRST SWITCH OUTPUT

FIG.7H SECOND ADDER OUTPUT

FIG.7I VIDEO SIGNAL

FIG.7J OUTPUT INTENSITY OF LASER DIODE

FIG. 8

FIG.9A DRIVING CURRENT

FIG.9B OUTPUT OF LD tx: RISING DELAY

FIG.9C OUTPUT OF LD

FIG.9D OUTPUT OF LD

PRIOR ART

LASER SCANNING DEVICE

BACKGROUND OF THE INVENTION

The present invention relates to a laser scanning device that emits a scanning laser beam which is modulated in accordance with video signal or the like.

A laser scanning device has been widely employed in imaging apparatuses. Typically, the laser scanning device is configured such that a laser beam emitted by a laser diode is deflected using a polygonal mirror to scan a predetermined angular range. While the laser beam is deflected, emission of the beam of the laser diode is ON/OFF modulated in accordance with a video signal or the like. The scanning beam is incident on a surface such as a photosensitive surface to be scanned, which surface is moved in a direction perpendicular to the scanning direction, thereby a two-dimensional latent image being formed on the surface.

In such a laser scanning device, in order to compensate for an individual difference of light emission characteristics so that density thickness of the formed image is standardized, the output intensity of the laser diode is feed-back controlled. For this purpose, the laser scanning device is provided with an automatic power control (hereinafter referred to as an APC) circuit, which controls a driving current supplied to the laser diode in accordance with the intensity of the laser beam.

Recently, the laser scanning device is required to achieve a high-speed and high-quality imaging operation. In particular, as the imaging speed increases, a rising edge characteristic (i.e., a shape of the rising edge of the waveform representing the intensity of the laser beam) of the laser diode which is turned ON and OFF in accordance with an imaging pattern is required to be improved.

Figure 9A:
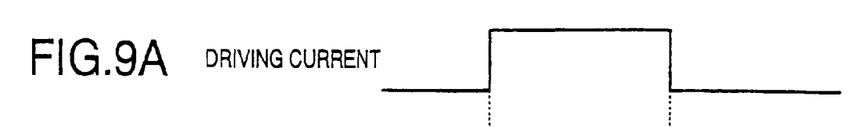
FIGS. 9A–9D show a timing chart illustrating rising-edge characteristics of a conventional laser scanning device.
Figure 9B:
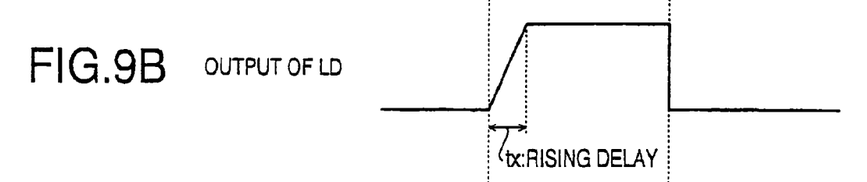

FIGS. 9A and 9B show a waveform of a driving current supplied to a laser diode, and a waveform showing the intensity of the laser beam emitted by the laser diode when the driving current shown in FIG. 9A is supplied. Generally, immediately after the driving current is supplied to the laser diode, the intensity of the laser diode does not respond to the driving current, and thus the rising edge of the waveform showing the intensity of the output laser beam inclines as shown in FIG. 9B. This delaying period tx (i.e., a delay from when the driving current is applied until the output intensity corresponds to the applied driving current) will be referred to as a rising delay hereinafter.

Due to the rising delay, an entire light amount (i.e., the quantity obtained by integrating the output intensity of the laser beam with respect to a time) is lower than an ideal case where the output intensity immediately corresponds to the applied driving current. When such a phenomenon occurs, since the entire light amount is lower than necessary, toner applied to the latent image is reduced, and thus, the image pattern exhibits insufficient density thickness. Further, the sharpness of the edge of the image pattern may be deteriorated.

Figure 9C:
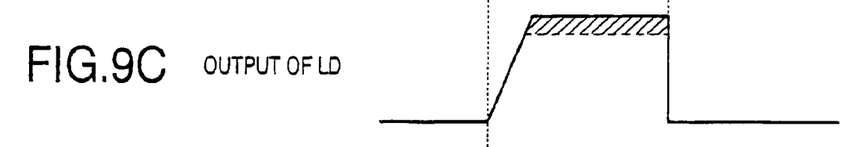

In order to cope with the problem described above, there has been an improvement in which the level of the driving current is increased as indicated in FIG. 9C, in which a hatched area represents the increased current level. It should be noted that the light amount corresponding to the hatched area corresponds to the light amount lowered by the rising delay. With this configuration, even though the rising delay occurs, the entire light amount becomes sufficient.

Figure 9D:
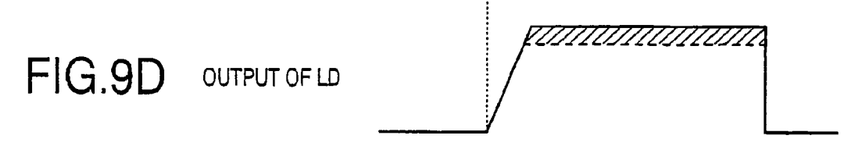

FIG. 9D shows the same configuration as shown in FIG. 9C except that the light emitting period is longer. In this case, the increased amount (i.e., the hatched area in FIG. 9D) is much greater than the lowered light amount due to the rising delay, and the entire light amount during the light emitting period becomes larger than necessary. In this case, the density thickness of the image pattern may be too thick, and the consumption of the toner increases.

It may be possible to compensate for the lowered light amount due to the rising delay if the increased intensity level is varied depending on the light emitting period. However, such a control is very complicated to apply to the laser scanning device, and may not meet the requirement for the high-speed and high-quality imaging.

SUMMARY OF THE INVENTION

The present invention is advantageous in that the deterioration of the image quality due to the rising delay is prevented.

For this purpose, according to the invention, there is provided a laser scanning apparatus, which is provided with a laser diode that is driven to emit a laser beam, a scanning optical system that scans the laser beam emitted by the laser diode on a surface to be scanned, and a controller that drives the laser diode by supplying an extra electrical current to the laser diode only at an initial stage of driving of the laser diode.

With this configuration, at an initial stage where the laser diode emits the laser beam, the output intensity is increased. Accordingly, the lowered amount of light during a light emitting period due to the rising delay can be compensated for by the increased intensity. Since the extra current is supplied only in the initial driving stage, the amount of light throughout a light emitting period will not become too large even when the light emitting period is relatively long.

Optionally, the controller may include a driving voltage generator that generates a driving voltage, a compensating voltage generator that generates a compensating voltage, an adder that adds the compensating voltage to the driving voltage, and a voltage-to-current converter that converts an output voltage of the adder to a driving current, which is supplied to the laser diode.

Further, the compensating voltage generator may be configured to generate the compensating voltage by attenuating the driving voltage. Alternatively, the compensating voltage may be obtained as a predetermined fraction of the driving voltage.

In a particular case, the compensating voltage generator may attenuate the driving voltage to a ratio of 1/X, X being a positive number.

Optionally, the controller may supply the extra electrical current to the laser diode for a predetermined period since the driving current is started to be supplied.

Further, the controller may include an automatic power control unit that receives the laser beam emitted by the laser diode and controls the driving voltage automatically in accordance with the intensity of the received laser beam.

Still optionally, the controller may include a temperature detection system that detects a temperature of the laser diode, and a variable attenuation circuit that varies the compensating voltage in accordance with the temperature detected by the temperature detection system.

Alternatively or optionally, the controller may include a temperature detection system that detects a temperature of the laser diode. The compensating voltage generator may be configured to vary the bias voltage in accordance with the temperature detected by the temperature detection system, and a second adder circuit that adds the bias voltage to the driving voltage.

Further optionally, the controller may include a first timing system that determines a timing at which the driving voltage is output in response to a video signal input from an external device, a delay circuit that delays an operation of the first timing system by a period of time necessary for an operation of the adder circuit, and a second timing system that determines a timing at which the compensating voltage is applied to the adder circuit in response to the video signal.

According to another aspect of the invention, there is provided a laser scanning apparatus, which is provided with a laser diode that is driven to emit a laser beam, a scanning optical system that scans the laser beam emitted by the laser diode on a surface to be scanned, a driving system that supplies an electrical current to the laser diode, and a controlling system that controls the driving system to supply an extra electrical current to the laser diode at an initial stage of driving of the laser diode. The controlling system controls the driving system not to supply the extra electrical current after the initial stage of driving of the laser diode.

Optionally, the controlling system may include a temperature detecting system that detects a temperature of the laser diode, the controlling system varies an amount of the extra electrical current in accordance with the temperature detected by the temperature detecting system.

In this case, the controlling system may vary the amount of the extra electrical current taking a change of a threshold current of the laser diode due to the variation of the temperature.

Alternatively or optionally, the controlling system may vary the amount of the extra electrical current taking a change of a characteristic of the laser diode due to the variation of the temperature.

DETAILED DESCRIPTION OF THE EMBODIMENTS

Hereinafter, the laser scanning devices according to embodiments of the invention will be described with reference to the drawings.

First Embodiment

Figure 1:
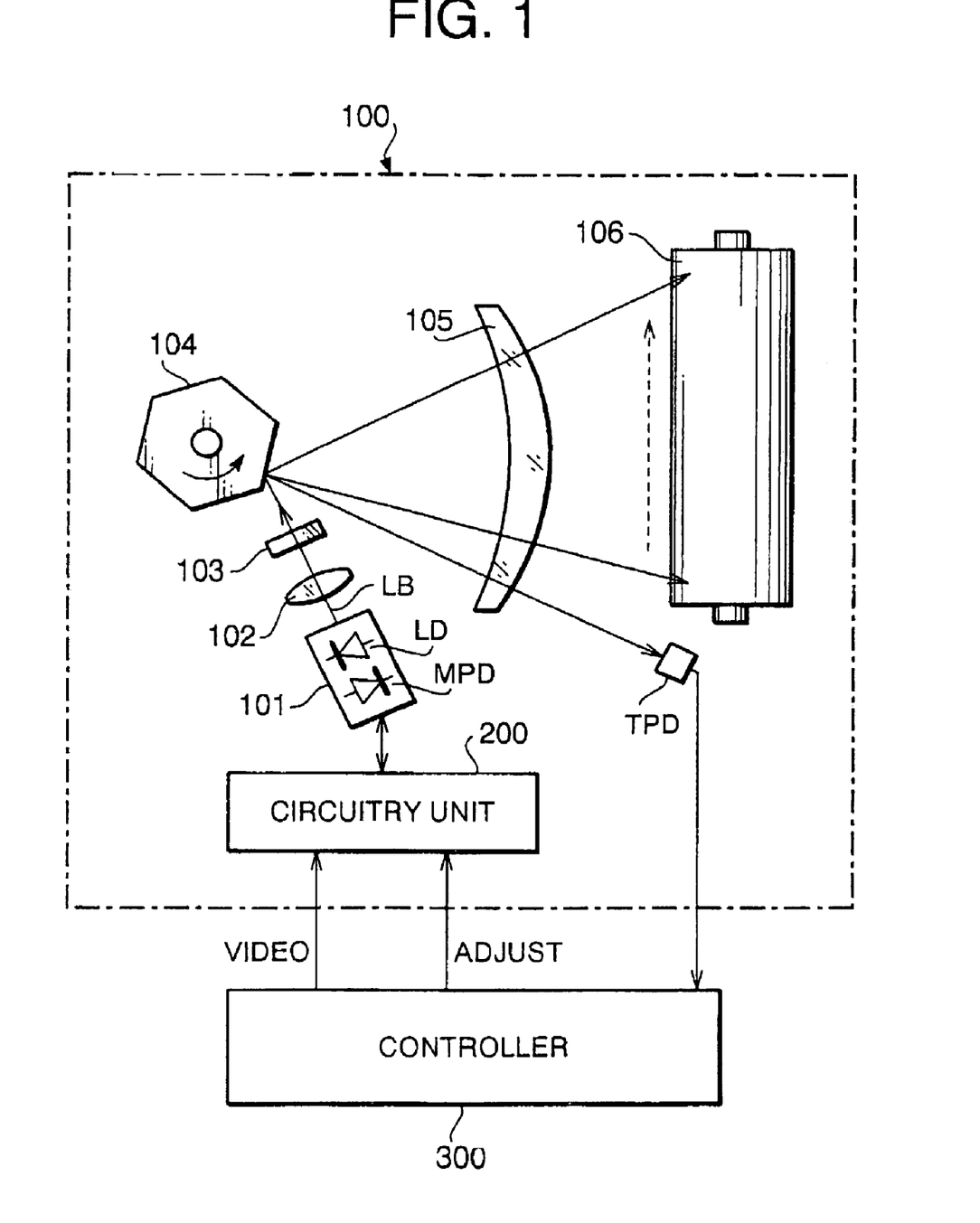
FIG. 1 schematically shows a structure of a laser scanning device according to which the present invention is applicable.

FIG. 1 schematically shows a configuration of a laser scanning device to which the present invention is applicable.

The laser scanning device includes a scanning unit 100, a circuitry unit 200 and a controller 300. The scanning unit 100 includes a light source 101 provided with a laser diode LD, a collimating lens 102 which collimates the laser beam emitted by the laser diode LD, and a beam shaping lens 103 including a cylindrical lens and the like for shaping a cross-sectional shape of the beam, a polygonal mirror 104 which deflects the laser beam to scan in a predetermined angular range, an fθ optical system 105 which functions to move the scanned beam on a surface to be scanned at a predetermined constant speed, and a photoconductive drum 106 having a photosensitive surface which is to be scanned by the scanning beam.

A monitoring photo diode MPD is implemented in the light source 101 integrally with the laser diode LD. The monitoring photo diode MPD receives the light beam emitted by the LD and generates a current corresponding to the intensity of the received laser beam, which current is input to the circuitry unit 200. Further, the scanning unit 100 includes a photo diode TPD provided at an outside of an imaging area defined on the photoconductive drum 106. The TPD is used for obtaining a synchronizing signal.

The circuitry unit 200 receives a video signal VIDEO corresponding to a density thickness of an image pattern to be formed from the controller 300, and controls a driving voltage in accordance with the video signal VIDEO. The driving voltage is converted into a driving current, which is supplied to the laser diode LD so that the laser beam modulated in accordance with the video signal VIDEO is emitted therefrom. With use of the output of the photo diode TPD, the controller 300 generates the synchronizing signal. An APC timing signal ADJUST, which is closely related to the synchronizing signal, is input to the circuitry unit 200. In order to form an image with a desired thickness density regardless of individual difference of the characteristic of the laser diode LD and/or other factors, the output intensity of the laser diode LD is controlled in accordance with the output of the monitoring photo diode MPD synchronously with the APC timing signal ADJUST, which is known as an APC control.

In such a laser scanning device, the intensity of the laser beam emitted by the laser diode LD corresponds to the image pattern represented by the video signal VIDEO input to the circuitry unit 200. The laser beam thus emitted is incident on the collimating lens 102 which collimates the diverging beam emitted by the laser diode LD. The cross-sectional shape of the collimated laser beam is shaped by the beam shaping lens 103. The beam is then incident on the polygonal mirror 104 which rotates at a high speed, and is deflected to scan in a predetermined angular range. The scanning laser beam passes through the fθ optical system 105 so that the beam forms a beam spot on a photoconductive surface of the photoconductive drum 106. The beam spot moves at a constant speed on the photoconductive surface. The scanning laser beam is received at a certain position by the photo diode TPD. The controller 300 generates a synchronizing signal based on the output of the photo diode TPD, and control the rotation of the polygonal mirror 104 in accordance with the thus obtained synchronous signal.

Figure 2:
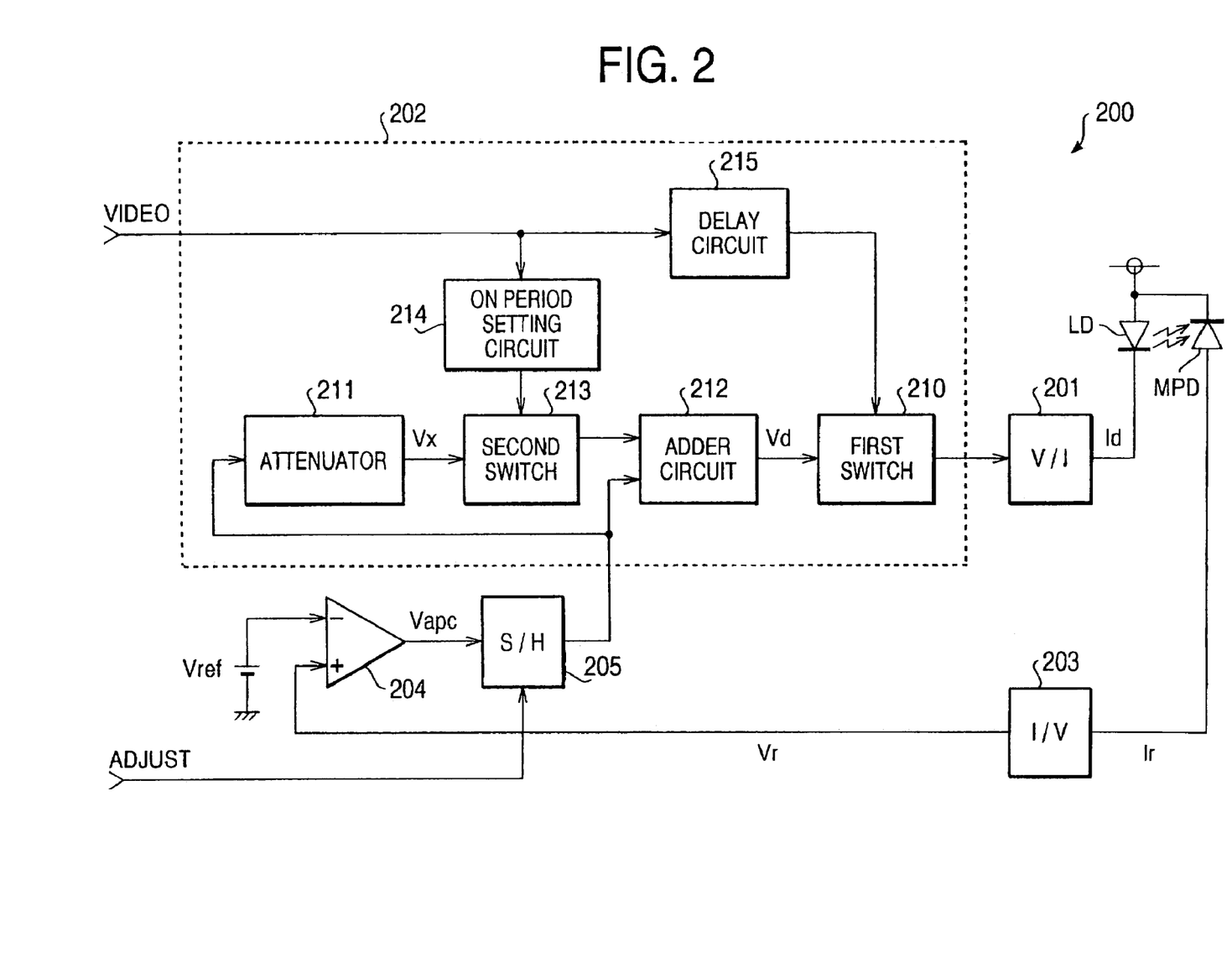
FIG. 2 is a block diagram showing an electrical configuration of a circuitry unit according to a first embodiment.

FIG. 2 is block diagram showing the configuration of the circuitry unit 200 according to the first embodiment. The circuitry unit 200 includes a V/I (voltage-to-current) circuit 201 which converts the driving voltage Vd to a driving current Id, a rising control circuit 202 which raises a level of the driving current at an initial stage of driving (which will be described in detail later), an I/V (current-to-voltage)

circuit 203 which converts the output current Ir of the monitoring photo diode MPD corresponding to the intensity of the laser beam emitted by the laser diode LD into a monitored voltage Vr, a comparator 204 that compares the monitored voltage Vr with a reference voltage Vref, and output an APC voltage Vapc which is used for driving the laser diode LD so that the output intensity of the laser diode LD is a predetermined constant value, and a sample-hold circuit 205 that samples the APC voltage Vapc synchronously with the APC timing signal ADJUST and holds the sampled voltage. It should be noted that the APC timing signal ADJUST is generated at a timing when the laser beam does not scan on a photoconductive drum 6.

The rising control circuit 202 includes a first switch circuit 210 which ON/OFF controls the voltage input to the V/I circuit 201 in accordance with the video signal VIDEO transmitted from the controller 300, and an attenuating circuit 211 that attenuates the APC voltage Vapc output by the sample-hold circuit 205 to generate a compensation voltage Vx which is 1/X of the APC voltage Vapc. Further, the rising control circuit 202 includes an adder circuit 212 which adds the APC voltage Vapc and the compensating voltage Vx, a second switch circuit 213 that ON/OFF controls the input of compensating voltage Vx to the adder circuit 212, an ON period setting circuit. 214 which controls the second switch circuit 213 to be in the ON state for a necessary period in accordance with the video signal VIDEO, and a delay circuit 215 that delays the ON operation of the first switch circuit 210 in accordance with the video signal VIDEO. It should be noted that the delay circuit 215 delays the time period where the first switch circuit 210 is in the ON state to output the driving voltage Vd.

FIGS. 4A–4G show a timing chart illustrating a relationship between signals at various positions of the circuitry unit 200 shown in FIG. 2.

When the driving current Id is supplied to the laser diode LD and the laser beam is emitted by the laser diode LD, the laser beam LB stats scanning the surface of the photoconductive drum 106. At the same time, the monitoring photo diode receives the laser beam (back beam) output by the laser diode LD and output the electrical current corresponding to the intensity of the received laser beam. The output current Ir of the monitoring photo diode LD is input to the I/V circuit 203, which converts the input current Ir to the monitor voltage Vr. The monitor voltage Vr is compared with the reference voltage Vref in the comparator 204, and the APC voltage Vapc which is used for controlling the intensity of the output beam of the laser diode LD to be constant.

Figure 3:
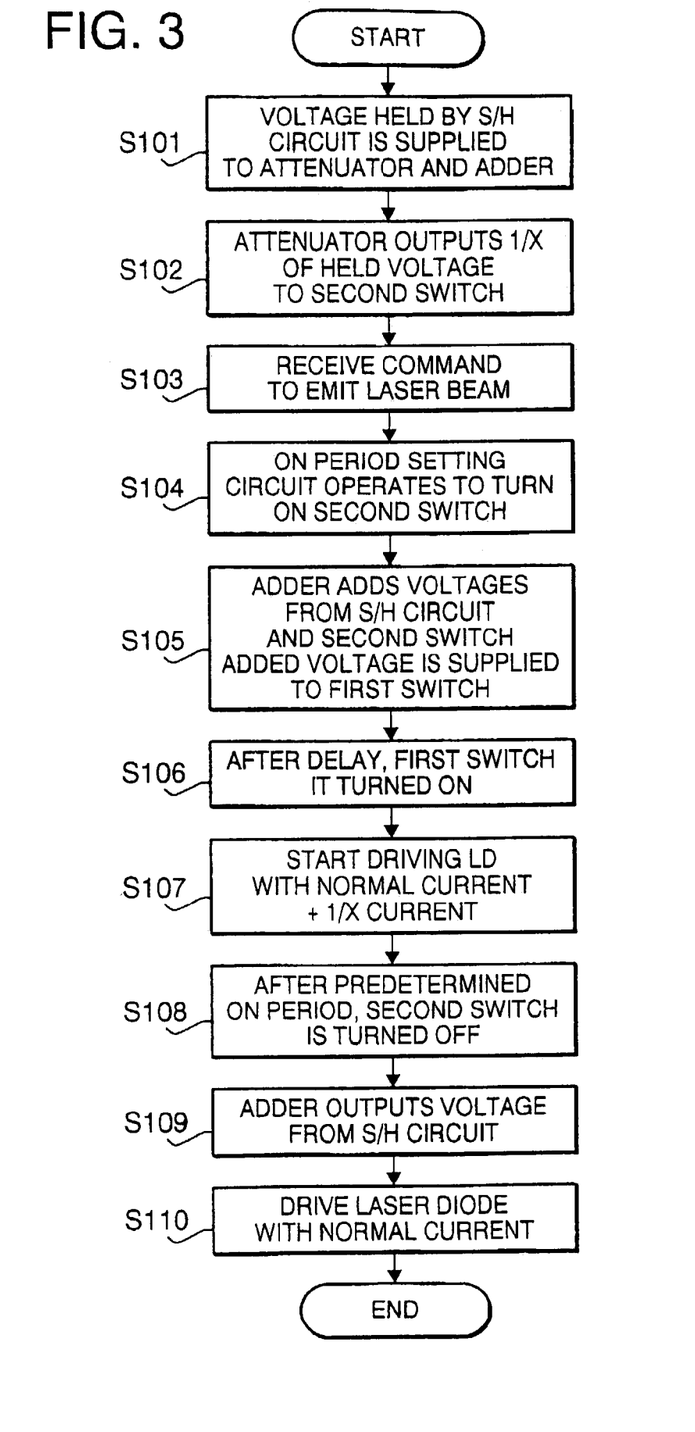
FIG. 3 is a flowchart illustrating a rising edge controlling operation.
Figure 4A:
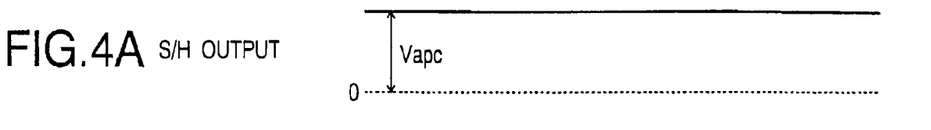
FIGS. 4A–4G show a timing chart illustrating a relationship between signals at various positions of the circuitry unit shown in FIG. 2.

Synchronously with, the APC timing signal AJUST, the APC voltage Vapc is sampled by the sample-hold circuit 205, shown in FIG. 2, at a timing where the laser beam does not scan on the photoconductive drum 106. The sampled signal is held till the subsequent sampling, and then a rising control by the rising control circuit 202 according to the present invention will be started (S101 of FIG. 3). The APC voltage Vapc as sampled and held is shown in FIG. 4A.

Figure 4B:
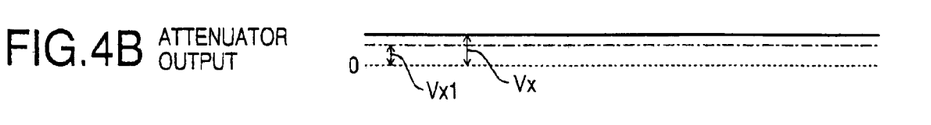

Next, in S102, the APC voltage Vapc with a held level is applied to the attenuating circuit 211, by which the voltage level is attenuated to 1/X (X being a positive number), which is referred to as a compensating voltage Vx. As shown in FIG. 4B, the compensating voltage is expressed as Vx=Vapc/X.

Figure 4C:
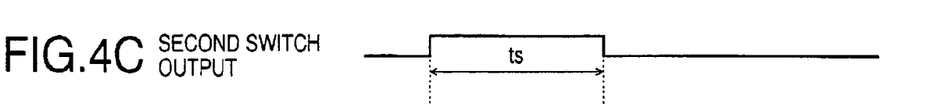
Figure 4D:
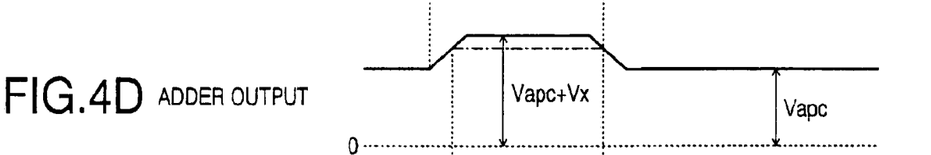
Figure 4E:
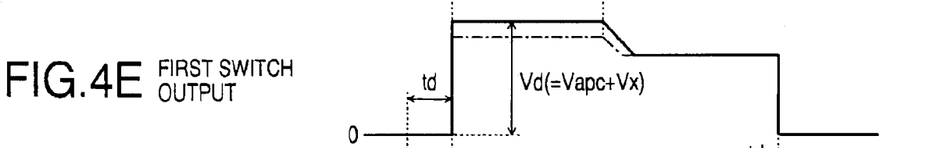
Figure 4F:
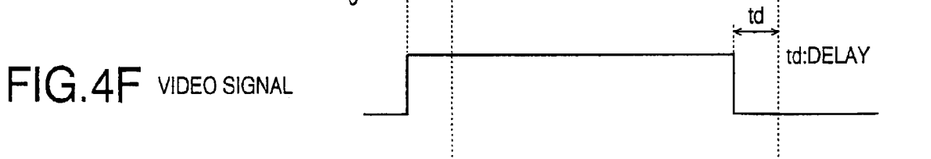

Then, as shown in FIG. 4F, the video signal VIDEO is input, and at a timing where the laser diode LD is to be driven to emit the laser beam (S103), an ON period setting circuit 214 turns ON the second switch 213 with a short delay (S104). The ON period setting circuit 214 is configured to output the ON signal continuously for a period corresponding to the rising delay of the laser diode LD to be used. Therefore, as shown in FIG. 4C, the ON period setting circuit 214 turns ON the second switch circuit 213 for a period of ts including the initial emitting period.

Figure 4G:
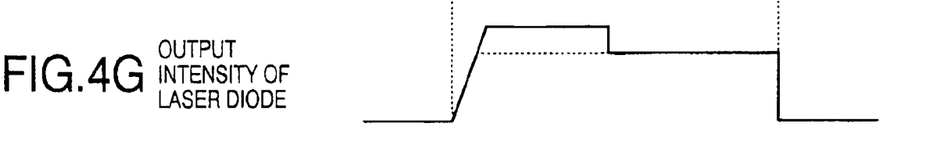

The adder circuit 212, as shown in FIG. 4D, adds the APC voltage Vapc and the compensating voltage Vx, and outputs the sum, which is input to the first switch circuit 210 as a driving voltage Vd for the laser diode LD (S105). Accordingly, the driving voltage Vd has a voltage which is the sum of the APC voltage Vapc and the compensating voltage Vx for the time period ts that is set by the ON period setting circuit 214. The delay circuit 215 outputs the ON signal after a time period td which is necessary for executing the addition by the adder circuit 212 described above to output the driving voltage Vd, so that the first switch circuit 210 is turned ON (S106). Therefore, as shown in FIG. 4E, it is ensured that the first switch circuit 210 outputs the driving voltage Vd which is the sum of the APC voltage Vapc and the compensating voltage Vx (S107), and the thus obtained driving voltage Vd is input to the V/I (voltage-to-current conversion) circuit 201. Accordingly, to the laser diode LD, a driving current Id corresponding to the driving voltage Vd is applied. As a result, the laser diode LD starts emitting the laser beam, the output intensity of which is as shown in FIG. 4G.

The intensity-current characteristics of the laser diode LD shows an inclined characteristic, i.e., the rising delay which occurs in compliance with the supply of the driving current. According to the above-described configuration, the driving current Id at the rising end corresponds to the sum of the APC voltage Vapc and the compensating voltage Vx. Therefore, the intensity of the laser beam after the rising portion exhibits an overshot characteristic (i.e., having an extra intensity), which corresponds to the sum of the intensity according to the APC voltage and the compensating voltage Vx. After the ON period ts set by the ON period setting circuit 214 has elapsed, that is, when the time during which the compensated voltage Vx should be added has elapsed, the ON period setting circuit 214 turns OFF the second switch circuit 213 (S108). Then, the adder circuit 212 is no longer supplied with the compensating voltage Vx. Accordingly, the output of the adder circuit 212 thereafter, i.e., the driving voltage Vd, is equal to the APC voltage Vapc (S109), and the driving current Id supplied to the laser diode LD corresponds to the driving voltage corresponding only to the APC voltage Vapc (S110).

As described above, by determining the quantity of the compensating voltage Vx and the time period ts during which the compensating voltage Vx is applied to the APC voltage Vapc so that the overshot quantity of the output intensity of the laser diode LD compensates for the decreased quantity of the intensity due to the rising delay, the problem of the lowered density thickness of the image at the initially drawn portion of the image pattern is solved. Accordingly, the image pattern having a sharp edge can be formed. Further, the exposing time period of the entire image pattern on the photoconductive drum can be well compensated for. Therefore, the density thickness of the entire image pattern will not be increased, which suppresses the increase of toner consumption.

Second Embodiment

Figure 5:
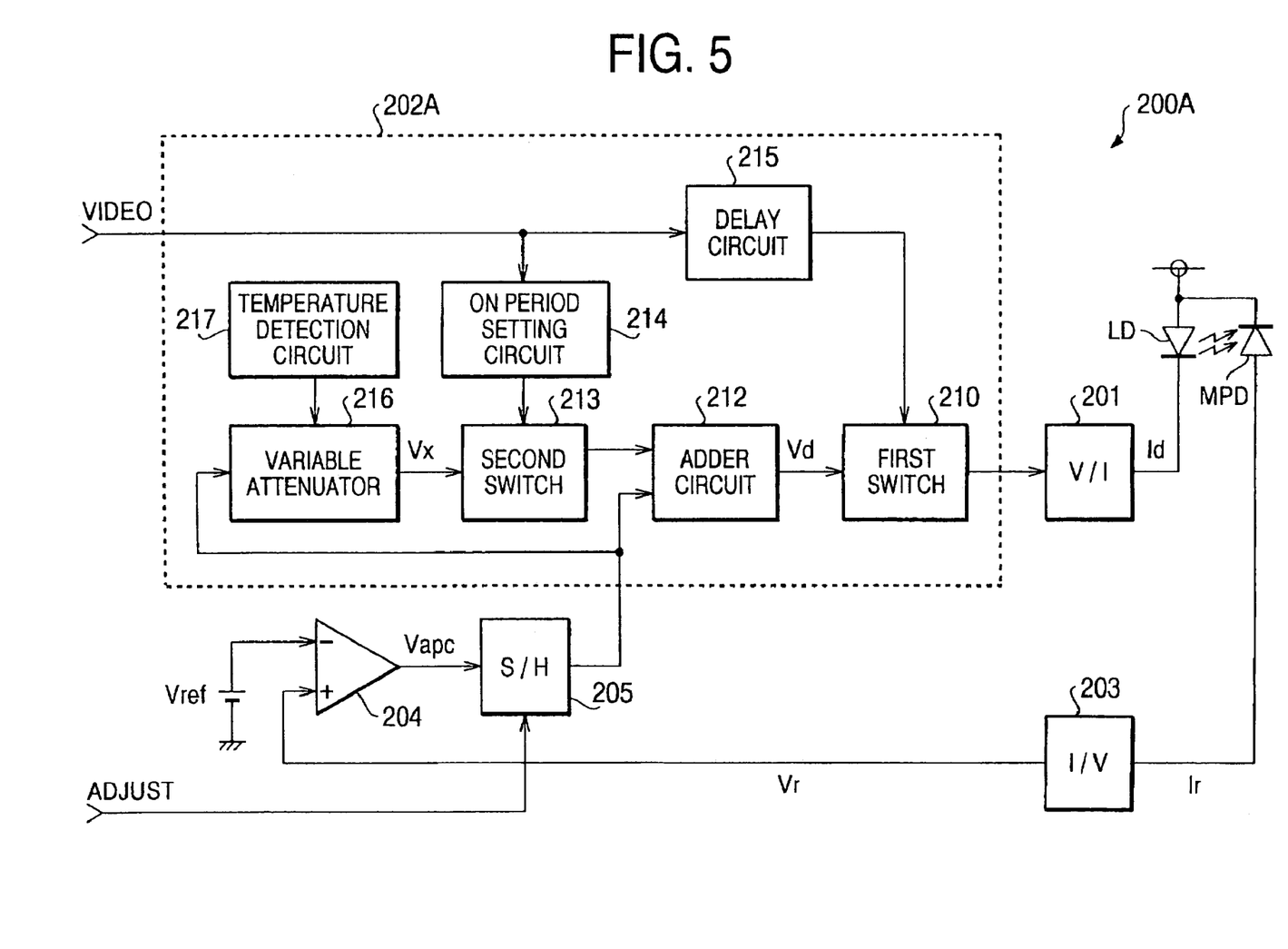
FIG. 5 is a block diagram showing an electrical configuration of a circuitry unit according to a second embodiment.

FIG. 5 is a block diagram showing an electrical configuration of a circuitry unit 200A according to a second embodiment. It should be noted that components similar to those in the first embodiment shown in FIG. 2 have the same reference numbers as in FIG. 2, and description thereof will not be repeated herein.

The circuitry unit 200A has a rising control circuit 202A, which includes the adder circuit 212 for adding an APC voltage Vapc sampled and held by the sample-hold circuit 205 and the compensating voltage Vx, the second switch circuit 213 for switching the compensating voltage Vx applied to the adder circuit 212, the ON period setting circuit 214 for turning ON the second switch circuit 213 for a certain period of time in accordance with the video signal VIDEO, and the delay circuit 215 for delaying the ON period of the first switch circuit 210 in accordance with the video signal VIDEO, as in the first embodiment.

A circuit for attenuating the APC voltage Vapc, which is output by the sample-hold circuit 205, to generate the compensating voltage Vx is configured as a variable attenuation circuit 216 in the second embodiment. Further, the second embodiment is provided with a temperature detection circuit 217 that detects the temperature of the laser diode LD. An attenuation amount of the variable attenuation circuit 216 is determined based on the temperature of the laser diode LD detected by the temperature detection circuit 217. Specifically, based on the detected temperature, an optimum attenuation amount is determined.

According to the embodiment, the variable attenuation circuit 216 increases the attenuation amount if the temperature detected by the temperature detection circuit 217 increases. That is, in this case, a ratio 1/X for generating the compensated voltage Vx is decreased, i.e., the value X is increased. If the temperature decreases, the attenuation amount is decreased by increasing the ratio 1/X, i.e., by decreasing the value X.

The basic operation of the circuitry unit 200A is similar to the circuitry unit 200 according to the first embodiment, and the operational timings are similar to the operation of those shown in FIGS. 4A–4G. It should be noted that, according to the second embodiment, the output (which is indicated by dotted lines, in FIG. 4B) of the variable attenuation circuit 216 is different from that of the first embodiment. The output of the attenuation circuit 216 varies as the voltage Vx1 depending on the temperature (i.e., Vx1 is variable). Therefore, the compensating voltage Vx (=Vx1) to be applied to the adder circuit 212 varies. As a result, the outputs of the adder circuit 212 and the first switch circuit 210 are as indicated by dotted lines in FIGS. 4D and 4E.

Since the outputs of the attenuation circuit 216 is determined based on the temperature characteristics of the laser diode LD, regardless of the above variation of the output voltage of the attenuation circuit 216, the output intensity of the laser diode LD at the overshooting period is similar to that of the first embodiment, as shown in FIG. 4G.

In some types of the laser diode LD, the degree of the overshoot at the rising end of the output intensity varies, and the effect of the compensating voltage to the output intensity of the laser beam may decrease according to the first embodiment. Generally, when the temperature increases, the degree of the overshoot (i.e., extra or additional amount) increases, and therefore, the ratio 1/X of the variable attenuation circuit should be made smaller. According to the second embodiment, the degree of the overshoot is measured in advance, and the compensating voltage Vx is varied in accordance with the temperature change so that the optimum attenuation amount is used, i.e., the optimum compensating voltage Vx is determined. Accordingly, regardless of the temperature, the degree of the overshoot can be kept substantially constant according to the second embodiment.

Third Embodiment

Figure 6:
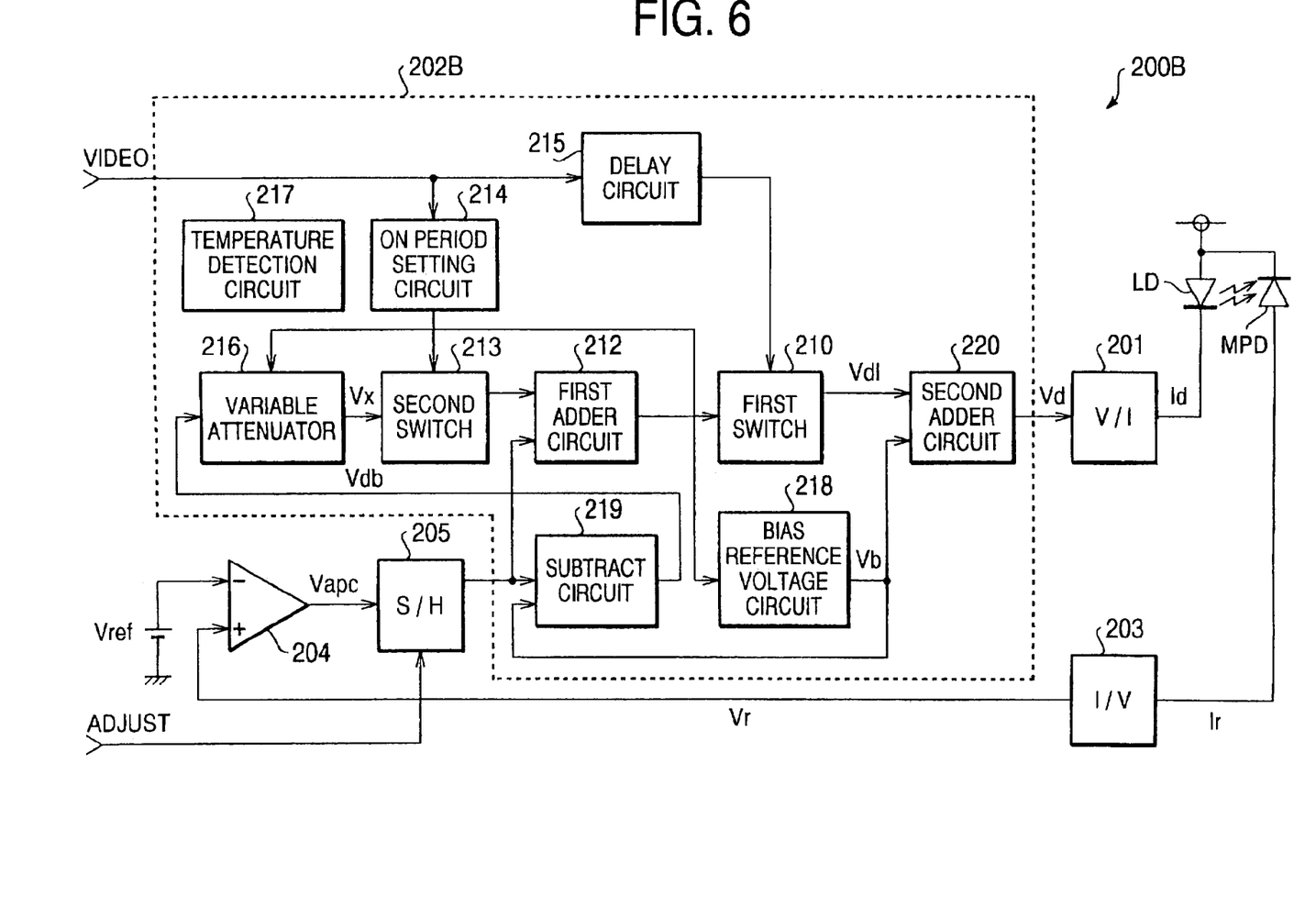
FIG. 6 is a block diagram showing an electrical configuration of a circuitry unit according to a third embodiment.

FIG. 6 is a block diagram showing a circuitry unit 200B of the electrical configuration of the laser scanning device according to a third embodiment. It should be noted that components similar to those in the second embodiment shown in FIG. 5 are indicated by the same reference numbers as in FIG. 5, and description thereof will not be repeated herein. It should be noted that a first adder circuit 212 of the third embodiment is equivalent to the adder circuit 212 in the first and second embodiments.

In the circuitry unit 200B, a rising control circuit 202B is configured such that a bias reference voltage circuit 218 and a subtraction circuit 219 are provided in addition to the configuration of the rising control circuit 202A of the second embodiment. The bias reference voltage circuit 218 controls a bias reference voltage Vb of the laser diode LD in accordance with the temperature detected by the temperature detection circuit 217. The subtraction circuit 219 subtracts the bias reference voltage Vb from the APC voltage Vapc which is sampled and held by the sample-hold circuit 205, and outputs the subtracted voltage Vdb. The variable attenuation circuit 216 attenuates the subtracted voltage Vdb to generate the compensating voltage Vx. The first adder circuit 212 adds the APC voltage Vapc and the compensating voltage Vx, and outputs the driving voltage Vd1, to which the bias voltage Vb output by the bias reference voltage circuit 218 is added by a second adder circuit 220, and the final driving voltage Vd is obtained as the output of the second adder circuit 220.

Similarly to the second embodiment, the attenuation ratio of the variable attenuation circuit 216 is controlled in accordance with the temperature detected by the temperature detection circuit 217 such that the optimum attenuation ratio is set. The bias reference voltage circuit 218 raises the bias reference voltage Vb when the temperature detected by the temperature detection circuit 217 is high, while lowers the bias reference voltage Vb when the temperature is low.

The operation of the circuitry unit 200B will be described in detail with reference to a timing chart shown in FIGS. 7A through 7J. The basic operation of the circuitry unit 200B is substantially the same as the second embodiment, and the difference will be described in detail hereinafter.

Figure 7A:
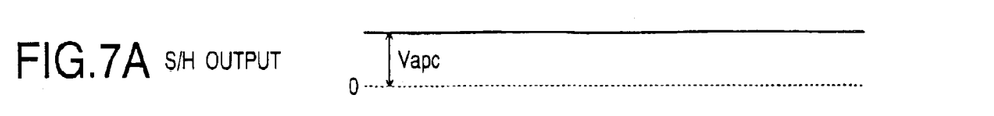
FIGS. 7A–7J show a timing chart illustrating a relationship between signals at various positions of the circuitry unit shown in FIG. 6.
Figure 7B:
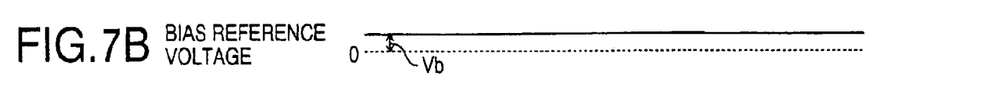

Based on the temperature detected by the temperature detection circuit 217, the bias reference voltage circuit 218 generates the bias reference voltage Vb (FIG. 7B).

Figure 7C:
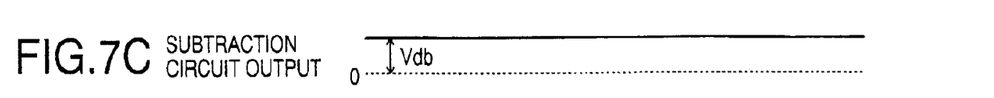
Figure 8:
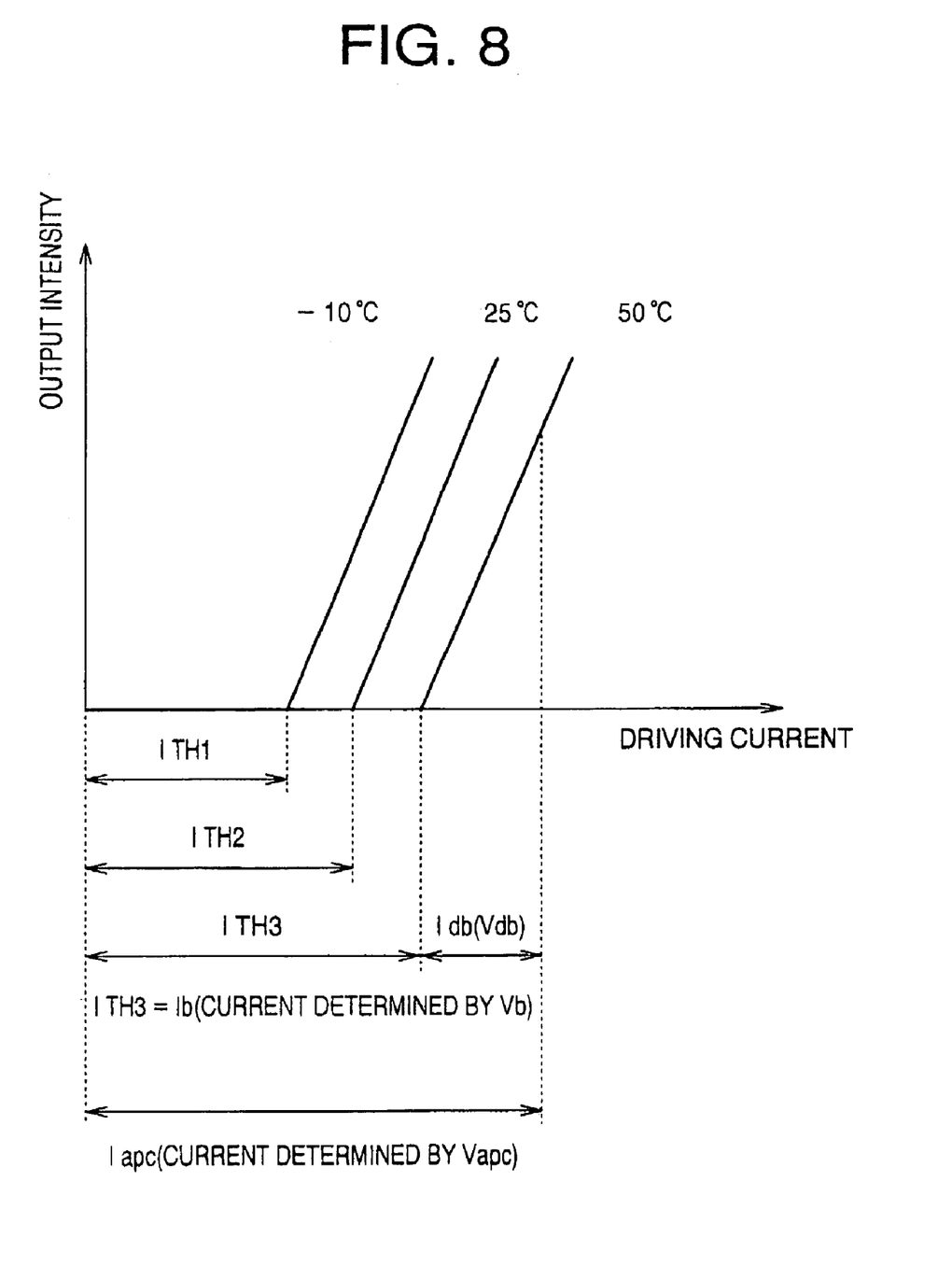
FIG. 8 is a graph showing temperature dependency of output intensity characteristics of a laser diode.

Generally, the laser diode shows a forward current-output intensity characteristic as in the examples shown in FIG. 8. When the temperature increases, the threshold value of the forward current changes $I_{TH1}$, $I_{TH2}$ and $I_{TH3}$ in this order. The bias reference voltage circuit 218, therefore, controls the bias reference voltage Vb so as to correspond to the threshold current values $I_{TH1}$, $I_{TH2}$ or $I_{TH3}$. Then, at the subtraction circuit 219, the bias reference voltage Vb shown in FIG. 7B is subtracted from the APC voltage Vapc (FIG. 7A). By this subtraction, a range of the APC voltage Vapc corresponding to the APC current Iapc within an effective area, with which the laser diode LD emits the laser beam appropriately, is obtained. Specifically, in FIG. 8, when the temperature is 50° C., if the bias reference voltage Vb is set to have a value corresponding to the threshold current $I_{TH3}$, the subtracted voltage Vdb is obtained by subtracting the bias reference voltage Vb from the APC voltage Vapc. The subtracted voltage Vdb thus obtained is regarded as the APC voltage when the threshold current of the laser diode LD is zero. FIG. 7C shows such a voltage Vdb, which will be referred to as a corrected APC voltage Vdb.

Figure 7D:
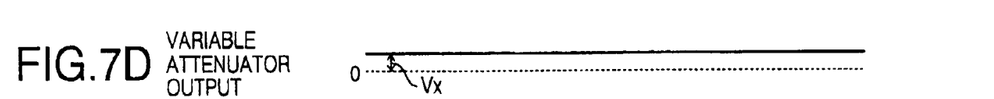
Figure 7E:
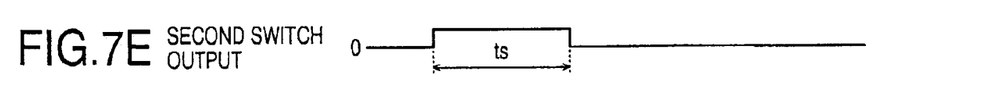
Figure 7F:
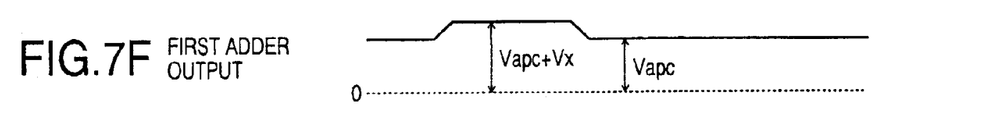
Figures 7G, 7H:
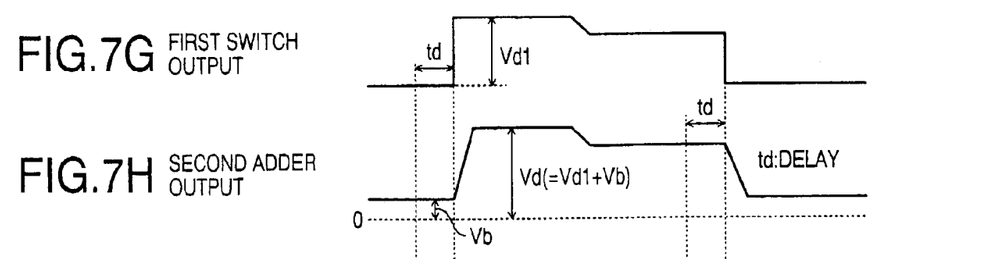
Figure 7I:
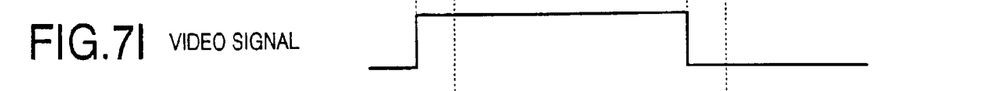
Figure 7J:
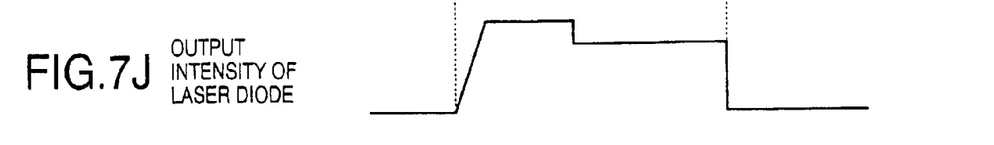

Using the thus obtained corrected APC voltage Vdb, the variable attenuation circuit 216 generates the compensating voltage Vx in accordance with the detected temperature (FIG. 7D). Then, the ON period setting circuit 214 turns ON the second switch circuit 213 for a period of ts including the initial emitting period (FIG. 7E), and the compensating voltage Vx is added to the non-corrected APC voltage Vapc by the first adder circuit 212 (FIG. 7F) to obtain the driving voltage Vd1 output from the first switch circuit 210 (FIG. 7G). Then, by adding the bias reference voltage Vb to the driving voltage Vd1 at the second adder circuit 220, the driving voltage Vd which includes the effect of the change of the threshold current due to the change of the temperature of the laser diode LD is output by the second adder circuit 220 (FIG. 7H). The output intensity of the laser diode LD when the video signal VIDEO shown in FIG. 7I is input is indicated in FIG. 7J.

As described above, according to the third embodiment, even though the threshold current value changes in accordance with the change of the temperature, an appropriate compensation voltage with respect to the effective range of the driving current-output intensity characteristic can be obtained, and an appropriate overshooting effect can be achieved regardless of the temperature change. Depending on the type of the laser diode, the degree of the overshoot at the rising end according to the temperature may vary considerably. According to the third embodiment, similar to the second embodiment, even in such a case, the degree of the overshoot may be held substantially constant.

In the above-described embodiments, the APC voltage is used as the driving voltage of the laser diode. However, the invention need not be limited to such configurations, and various modifications can be made without departing from the scope of the invention. For example, a driving voltage other than the APC voltage may include a voltage source which set the driving voltage based only on the video signal.

Further, the compensating voltage need not be one which is obtained by attenuating the driving voltage.

Further, if the delay of the adder circuit which adds the driving voltage and the compensating voltage can be negligible, the delay circuit and the first switch employed in the above-described embodiments may be omitted.

The present disclosure relates to the subject matter contained in Japanese Patent Application No. 2002-151817, filed on May 27, 2002, which is expressly incorporated herein by reference in its entirety.

What is claimed is:

1. A laser scanning apparatus, comprising:
a laser diode that is driven to emit a laser beam;
an optical scanner that scans the laser beam emitted by the laser diode on a surface to be scanned; and
a controller that drives said laser diode by supplying an extra electrical current to said laser diode at an initial stage of driving said laser diode during an imaging operation, the initial stage comprising a time during which an output of the laser diode rises to a predetermined level during the imaging operation, the controller comprising:
 a driving voltage generator that generates a driving voltage;
 a compensating voltage generator that generates a compensating voltage;
 an adder that adds the compensating voltage and the driving voltage; and
 a voltage-to-current converter that converts an output voltage of said adder to a driving current, which is supplied to said laser diode.

2. The laser scanning apparatus according to claim 1, wherein said compensating voltage generator generates the compensating voltage by attenuating the driving voltage.

3. The laser scanning apparatus according to claim 2, wherein said compensating voltage generator attenuates the driving voltage to a ratio of 1/X, X being a positive number.

4. The laser scanning apparatus according to claim 1, wherein the time during which said controller supplies the extra electrical current to said laser diode comprises a predetermined period from when the driving current begins to be supplied to the laser diode.

5. The laser scanning apparatus according to claim 1, wherein said controller further comprises an automatic power control unit that receives the laser beam emitted by said laser diode and controls the driving voltage automatically in accordance with an intensity of the received laser beam.

6. The laser scanning apparatus according to claim 1, wherein said controller further comprises a temperature detector that detects a temperature of said laser diode,
 wherein said compensating voltage generator is configured to vary the compensating voltage in accordance with the temperature detected by said temperature detector.

7. The laser scanning apparatus according to claim 1, wherein said controller further comprises:
a temperature detector that detects a temperature of said laser diode;
a bias voltage changer that varies a bias voltage in accordance with the temperature detected by said temperature detector; and
a second adder that adds the bias voltage to the driving voltage.

8. The laser scanning apparatus according to claim 1, wherein said controller further comprises:
a first timer that determines a first timing at which the driving voltage is output in response to a video signal input from an external device;
a delay circuit that delays an operation of said first timer by a period of time necessary for an operation of the adder; and
a second timer that determines a second timing at which the compensating voltage is applied to said adder in response to the video signal.

9. A laser scanning apparatus, comprising:
a laser diode that is driven to emit a laser beam;
an optical scanner that scans the laser beam emitted by the laser diode on a surface to be scanned;
a driver that supplies an electrical current to said laser diode; and
a controller that controls said driver to supply an extra electrical current to said laser diode at an initial stage of driving said laser diode during an imaging operation, said controller controlling said driving system not to supply the extra electrical current after the initial stage of driving of said laser diode, the initial stage comprising a time during which an output of said laser diode rises to a predetermined level during the imaging operation;
wherein said controller comprises a driving voltage generator that generates a driving voltage; a compensating voltage generator that generates a compensating voltage; an adder that adds the compensating voltage and the driving voltage: and a converter that converts an output voltage of the adder to a driving current, which is supplied to said laser diode.

10. The laser scanning apparatus according to claim 9, wherein said controller comprises a temperature detector that detects a temperature of said laser diode, said controller varying an amount of the extra electrical current in accordance with the temperature detected by said temperature detector.

11. The laser scanning apparatus according to claim 10, wherein said controller further varies the amount of the extra electrical current in accordance with a change of a threshold current of said laser diode due to a variation of the temperature.

12. The laser scanning apparatus according to claim 10, wherein said controller further varies the amount of the extra electrical current in accordance with a change of a characteristic of said laser diode due to a variation of the temperature.

13. A method for controlling a laser diode comprising:
   driving a laser diode to emit a laser beam during an imaging operation;
   scanning the laser beam emitted by the laser diode on a surface to be scanned;
   generating a driving voltage;
   generating a compensating voltage;
   adding the compensating voltage to the driving voltage to provide an output voltage;
   converting the output voltage to a driving current;
   supplying the driving current to the laser diode; and
   supplying an extra electrical current to the laser diode at an initial stage of the driving of the laser diode, the initial stage comprising a time during which an output of the laser diode rises to a predetermined level during the imaging operation.

14. The method for controlling a laser diode according to claim 13, wherein generating the compensating voltage comprises attenuating the driving voltage.

15. The method for controlling a laser diode according to claim 14, wherein the driving voltage is attenuated to a ratio of 1X, X being a positive number.

16. The method for controlling a laser diode according to claim 13, further comprising:
   controlling the driving voltage automatically in accordance with an intensity of the emitted laser beam.

17. The method for controlling a laser diode according to claim 13, further comprising:
   detecting a temperature of the laser diode; and
   varying the compensating voltage in accordance with the detected temperature.

18. The method for controlling a laser diode according to claim 13, further comprising:
   detecting a temperature of the laser diode;
   varying a bias voltage in accordance with the detected temperature; and
   adding the bias voltage to the driving voltage.

* * * * *